United States Patent [19]

Tanaka et al.

[11] Patent Number: 4,893,275

[45] Date of Patent: Jan. 9, 1990

[54] HIGH VOLTAGE SWITCHING CIRCUIT IN A NONVOLATILE MEMORY

[75] Inventors: Sumio Tanaka; Shigeru Atsumi, both of Tokyo; Nobuaki Ohtsuka; Keniti Imamiya, both of Yokohama, all of Japan

[73] Assignee: Kabushiki Kaisha Toshiba, Kawasaki, Japan

[21] Appl. No.: 173,563

[22] Filed: Mar. 25, 1988

[30] Foreign Application Priority Data

Mar. 31, 1987 [JP] Japan ................................. 62-78522

[51] Int. Cl.[4] ........................... G11C 7/00; G05F 3/16; H03K 3/01
[52] U.S. Cl. ............................... 365/189.09; 365/185; 365/230.06; 365/226; 323/313; 323/317; 307/296.6
[58] Field of Search ............... 365/189, 185, 184, 226, 365/228, 230, 189.09, 230.06; 307/296.1, 296.6, 296.8; 323/311, 313, 315, 317; 364/264

[56] References Cited

U.S. PATENT DOCUMENTS 4,365,316 12/1982 Iwahashi et al. .................... 307/449
4,368,524 1/1983 Nakamura et al. ................. 365/226
4,565,932 1/1986 Kuo et al. ........................... 365/226
4,733,371 3/1988 Terada et al. ...................... 365/226

OTHER PUBLICATIONS

Carr et al., "Mos ILSI Design and Application", McGraw-Hill Book Company, New York, pub. 1972, pp. 42-49.
Atsumi et al., "Fast Programmable 256K ROM With On-Chip Test Circuits", IEEE Jour. of Solid State Circuits, vol. SC-20, No. 1, Feb. 1985, pp. 422-427.

Primary Examiner—Glenn A. Gossage
Attorney, Agent, or Firm—Finnegan, Henderson, Farabow, Garrett and Dunner

[57] ABSTRACT

A nonvolatile semiconductor memory device includes a power voltage select circuit that is comprised of first and second power source nodes, an output node, first and second depletion type MOS transistors connected in series between the first power source node and the output node, a third MOS transistor connected between an interconnection point between the first and second depletion type MOS transistors and the second power source node, and a fourth MOS transistor connected between the second power source node and the output node.

3 Claims, 3 Drawing Sheets

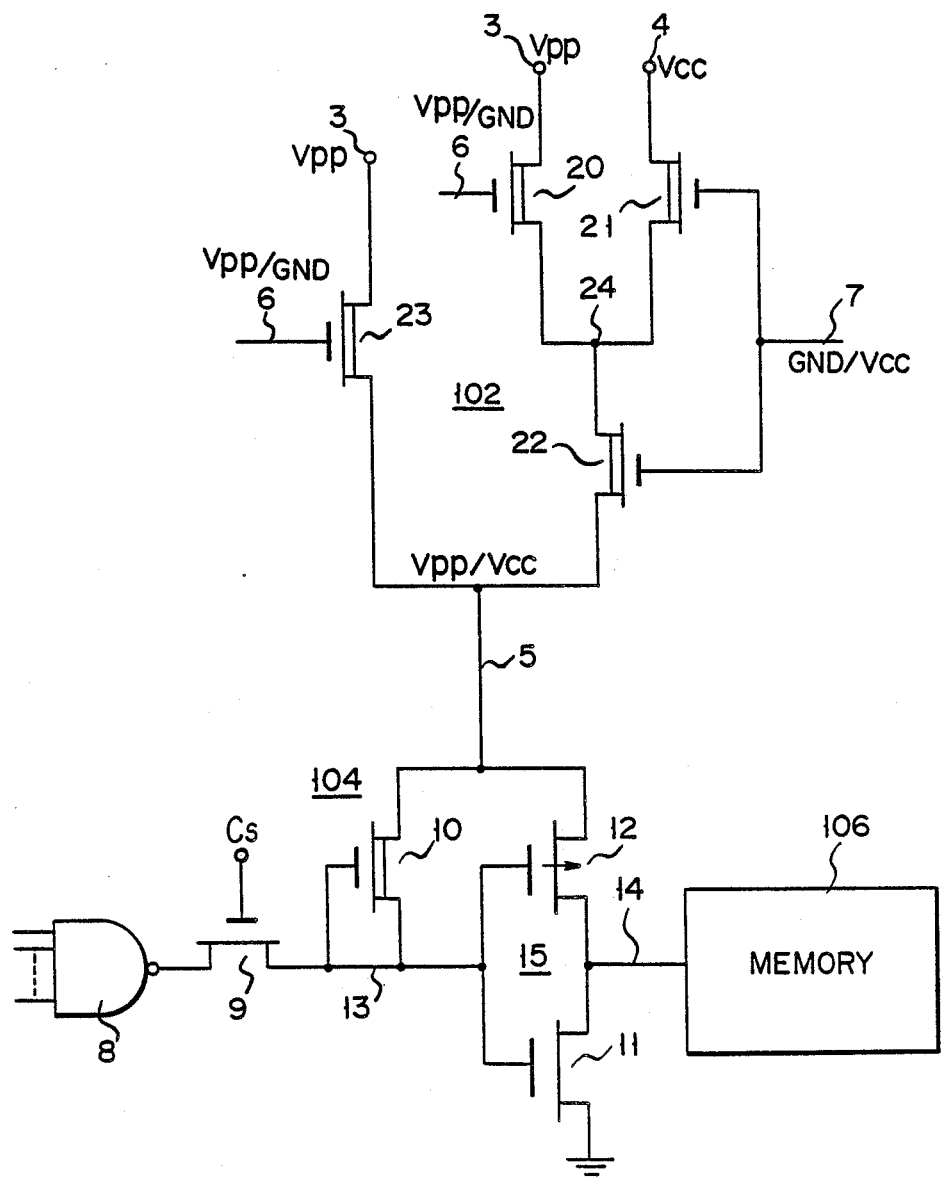
F I G. 2

HIGH VOLTAGE SWITCHING CIRCUIT IN A NONVOLATILE MEMORY

BACKGROUND OF THE INVENTION

1. Field of the Invention

This invention relates to a nonvolatile semiconductor memory device with a voltage select circuit, and more particularly to an erasable programmable read only memory (EPROM).

2. Description of the Related Art

In a conventional semiconductor memory device of the nonvolatile type, such as an EPROM, a high level potential is applied to the selected word line. This potential must be changed in such a way that it is 12.5 V in a write mode, while it is 5 V in a read mode. It is for this reason that a voltage select circuit is used in the memory device.

FIG. 1 shows a circuit arrangement of a conventional memory device made up of metal oxide semiconductor (MOS) transistors. Reference numerals 102, 104 and 106 designate a power voltage select circuit, a row decoder and a memory, respectively.

In a write mode for writing data into memory 106, write potential Vpp, e.g., 12.5 V is applied to nodes 3 and 6 of voltage select circuit 102. Read potential Vcc, e.g., 5 V, lower than Vpp is applied to node 4. Ground potential GND is applied to node 7. Under this condition, depletion type N channel MOS transistor 1 is turned on, while depletion type N channel MOS transistor 2 is turned off for the moderate threshold voltage of depletion type transistor 2.

When, however, the threshold voltage of depletion type transistor 2 is relatively large, a channel is set up between the source and drain of the transistor even if node 7 is placed at ground potential. Therefore, if a potential difference exists between the source and drain, current flows through the source-drain path and the potential at node 5, is pulled toward Vcc potential, resulting in a voltage reduction from Vpp (12.5 V) to a potential equal to Vpp minus the potential shifted toward Vcc.

In a read mode, Vpp potential is applied to node 3. Read potential Vcc is applied to nodes 4 and 7. Ground potential GND is applied to node 6. Under this condition, transistor 1 is turned off, and transistor 2 is turned on. As a result, read potential Vcc appears at node 5. Address signals from a row address buffer (not shown) are applied as an address input to NAND gate 8 of row decoder 104. When address signals are all logical "1", a logical "0" signal is output. In other conditions, a logical "1" signal is output. This signal is input to the gate of depletion type MOS transistor 10 and the input terminal of CMOS inverter 15 made up of enhancement type N channel MOS transistor 11 and enhancement type P channel MOS transistor 12.

In a read mode, read potential Vcc is applied to node 5. If address signals to NAND gate 8 are all logical "1", NAND gate 8 outputs a logical "0" signal. This output signal is applied to the input terminal of CMOS inverter 15. In turn, P channel MOS transistor 12 of inverter 15 is turned on, while N channel MOS transistor 11 is turned off. Read potential Vcc is applied through P channel MOS transistor 12 to word line 14. The result is that word line 14 is selected, a corresponding memory cell in memory 106 is selected, and data is read out from the memory. Actually, to select the memory cell, the bit line associated with the selected memory cell must be selected. This is not essential, and hence no further description of it will be given here.

In a write mode, potential Vppa, equal to Vpp minus the potential shifted toward Vcc, is applied to node 5. When address signals applied to NAND gate 8 are all "1's", this gate 8 outputs a "0" signal. The output signal from NAND gate 8 is input to the input terminal of CMOS inverter 15, so that P channel MOS transistor 12 of inverter 15 is tuned on, while N channel MOS transistor 11 is turned off. Then, potential Vppa is applied via transistor 12 to word line 14. Finally, word line 14 is selected, a corresponding memory cell of memory 106 is specified, and data is written into the memory.

In an EPROM, a high potential is applied to the control gate, so that electrons are generated due to avalanche occurring in the vicinity of the drain. The electrons are absorbed by the control gate for data writing. In this type of the semiconductor memory device, if a write potential is lower than a predetermined potential, electrons are insufficiently absorbed by the control gate, possibly causing an erroneous data write.

In the power voltage select circuit as mentioned above, the potential appearing at node 5 is reduced from the write potential Vpp. Therefore, an insufficient number of electrons are injected to the control gate, possibly causing an erroneous write operation.

SUMMARY OF THE INVENTION

Accordingly, an object of this invention is to provide a nonvolatile semiconductor memory device with a voltage select circuit which outputs a given write potential without any potential drop.

To achieve the above object, there is provided a nonvolatile semiconductor memory device with a power voltage select circuit, the improvement in which the power voltage select circuit is comprised of: first and second power source nodes; an output node; first and second depletion type MOS transistors connected in series between the first power source node and the output node; a third MOS transistor connected between an interconnection point between the first and second depletion type MOS transistors and the second power source node; and a fourth MOS transistor connected between the second power source node and the output node.

BRIEF DESCRIPTION OF THE DRAWINGS

FIG. 2 shows a circuit diagram of a semiconductor memory device with a power voltage select circuit according to an embodiment of this invention.

DETAILED DESCRIPTION OF THE PREFERRED EMBODIMENTS

Figure 1:
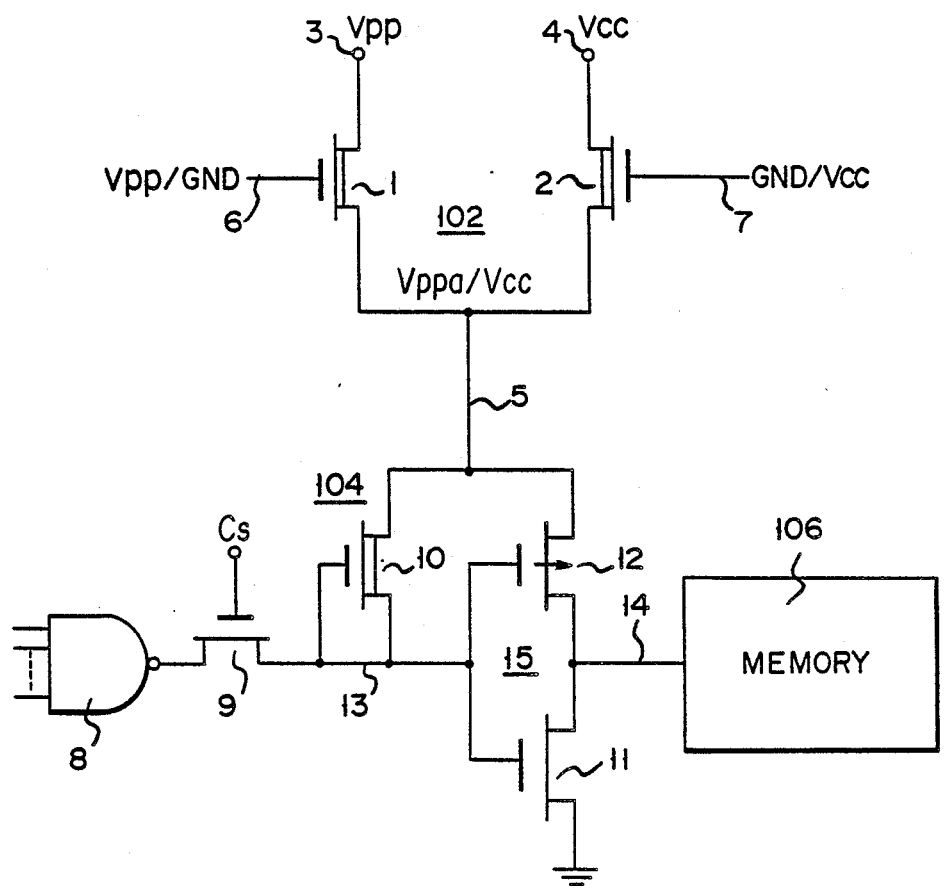
FIG. 1 shows a circuit diagram of a conventional semiconductor memory device with a power voltage select circuit.

FIG. 2 shows a circuit arrangement of a semiconductor memory device with a power voltage select circuit according to an embodiment of this invention. In this figure, portions similar to portions of FIG. 1 are designated by the reference symbols of FIG. 1, for ease of explanation. Power voltage select circuit 102 includes MOS transistors 20 to 23 of the depletion type. Transistors 21 and 22 are connected between node 5 as the output terminal of voltage select circuit 102 and read potential Vcc of 5 V, for example. Transistor 20 is connected between node 24 between transistors 21 and 22, and write potential Vpp, e.g., 12.5 V (second potential). Transistor 23 is connected between write potential Vpp and node 5. Decoder 104 is made up of NAND gate 8 and MOS transistors 9 to 12. Transistors 9 to 11 are of the N channel type, and transistor 12 is of the P channel type. Transistors 9, 11 and 12 are of the enhancement type, and transistor 10 is of the depletion type. Transistors 11 and 12 make up complementary CMOS inverter 15. NAND gate 8 is coupled to a row address circuit (not shown). NAND gate 8 NANDs these address signals, and outputs logical "1" or "0". The output terminal of NAND gate 8 is connected to the input terminal of CMOS inverter 15, or the gates of transistors 11 and 12, via transistor 9. A control signal CS is input to the gate of transistor 9. The memory cells connected to word line 14 are turned on only when the word line 14 in this row decoder 104 is selected. Transistors 11 and 12 are connected in series between node 5 and ground potential. The source of transistor 12 is connected to node 5, and its drain is connected to the drain of transistor 11. The source of transistor 11 is connected to ground potential. The gates of transistors 11 and 12 are interconnected. Transistors 10 is connected between node 5 and the input terminal of CMOS inverter 15. The gate of transistor 10 is connected to the output terminal of NAND gate 8 via transistor 9. The output terminal of CMOS transistor 15, or the interconnection point of transistors 11 and 12, is connected to word line 14. This word line is connected to memory 106. More specifically, word line 14 is connected to the control gate of a memory cell (not shown), an EPROM, for example.

In the semiconductor memory device of FIG. 2, in a write mode for writing data into memory 106, write potential Vpp at 12.5 V, for example, is applied to nodes 3 and 6, and read potential Vcc at 5 V, for example, lower than Vpp, is applied to node 4. Node 7 is coupled with ground potential GND. Under this condition, transistors 20 and 23 are turned on, while transistors 21 and 22 are turned off. In this case, transistor 20 is turned on, so that potential approximate to Vpp is applied to node 24. As a result, that potential appears at node 5. In a read mode, potential Vpp is applied to node 3, and read potential Vcc is applied to nodes 4 and 7. Ground potential GND is applied to node 6. As a result, transistors 20 and 23 are turned off, and transistors 21 and 22 are turned on. Therefore, read potential Vcc appears at node 5.

In a data read mode, potential Vcc is applied to node 5. If address signals to NAND gate 8 are all "1's", this gate outputs a "0" signal. Transistor 9 is turned on by a gate control signal (not shown). The "0" signal from NAND gate 8 is input to the input terminal of CMOS inverter 15 and the gate of transistor 10. The "0" signal is applied to the input terminal of CMOS inverter 15, so that transistor 12 is turned on, and transistor 11 is turned off. As a result, the Vcc potential appears at the output terminal of CMOS inverter 15. Word line 14 is selected, and data is read out from a selected memory cell (not shown) of memory 106. Actually, the bit line associated with the memory cell must be selected for the memory cell selection. This is not shown here.

In a write mode, potential Vpp is applied to node 5. When address signals to NAND gate 8 are all "1's", the gate 8 produces a "0" signal. At this time, transistor 9 is turned on by a control signal CS. Accordingly, the "0" signal output from NAND gate 8 is input to the input terminal of CMOS inverter 15 and the gate of transistor 10. Application of the "0" signal to the input terminal of CMOS inverter 15 turns on transistor 12 and turns off transistor 11. The Vpp potential appears at the output terminal of CMOS inverter 15. Word line 14 is selected, and data is written into a selected memory cell of memory 106. As a matter of course, the bit line associated with the selected memory cell must be selected, for the memory cell selection.

Figure 3:
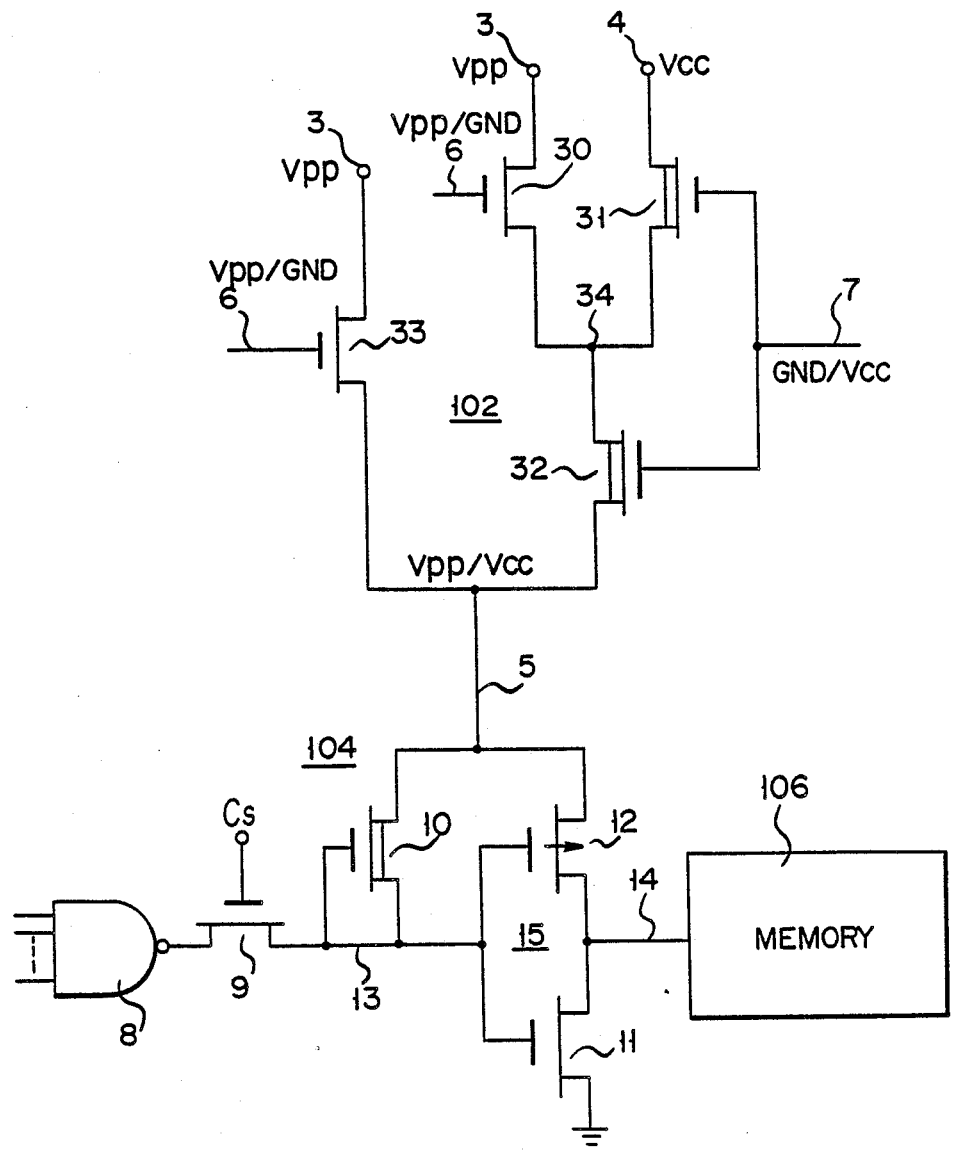
FIG. 3 shows a circuit diagram of a semiconductor memory device with a power voltage select circuit according to another embodiment of this invention.

FIG. 3 shows a circuit diagram of a semiconductor memory device with a power voltage select circuit according to another embodiment of this invention. In this embodiment, enhancement type transistors 30 and 33 are used for the depletion type transistors 20 and 23 in the FIG. 2 embodiment.

Also in this embodiment, the same potentials as those in FIG. 2 are applied to the related nodes. In a read mode, potential Vcc appears at node 5 of voltage select circuit 102. In a write mode, potential Vpp appears there. The circuit arrangement of this embodiment ensures correct read and write operations.

In the read mode, write potential Vpp may be pulled down to ground potential GND, since the potential applied in the read mode to node 6 is ground potential GND. In the write mode, however, threshold voltage drops will occur across the enhancement transistors 30 and 33. To prevent this, the potential applied to node 6 should be increased sufficiently to compensate for the threshold voltage drops.

In the embodiment of FIG. 3, transistors 31 and 32 correspond to transistors 21 and 22 of the FIG. 2 embodiment. Node 34 corresponds to node 24.

While voltage select circuit 102 is applied for row decoder 104 in the above-mentioned embodiments, it may be applied for any other circuits requiring the voltage select circuit.

What is claimed is:

1. A nonvolatile semiconductor memory device with a power voltage select circuit, wherein said power voltage select circuit comprises:
    first and second power source nodes;
    third and fourth nodes;
    an output node;
    first and second depletion type MOS transistors having source-drain paths connected in series between said first power source node and said output node, the gates of said first and second depletion type MOS transistors being connected to said third node;
    a third MOS transistor having a source-drain path connected between an interconnection point which is between the source-drain paths of said first and second depletion type MOS transistors and said second power source node, the gate of said third MOS transistor being directly connected to said fourth node; and
    a fourth MOS transistor having a source-drain path connected between said second power source node and said output node, the gate of said fourth MOS transistor being directly connected to said fourth node.

2. The semiconductor memory device according to claim 1, wherein said third and fourth transistors are both of the depletion type.

3. The semiconductor memory device according to claim 1, wherein said third and fourth transistors are both of the enhancement type.

* * * * *

UNITED STATES PATENT AND TRADEMARK OFFICE
CERTIFICATE OF CORRECTION

PATENT NO. : 4,893,275
DATED : January 09, 1990
INVENTOR(S) : Tanaka Sumio et al It is certified that error appears in the above-indentified patent and that said Letters Patent is hereby corrected as shown below:

Claim 1, Column 4, Line 51, "point" should be followed by --,--.

Signed and Sealed this

Twenty-eighth Day of November 1995

Attest:

BRUCE LEHMAN

Attesting Officer

Commissioner of Patents and Trademarks